(12) United States Patent
Jang et al.

(10) Patent No.: US 11,289,348 B2
(45) Date of Patent: Mar. 29, 2022

(54) WORKPIECE PROCESSING METHOD

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 397 days.

(21) Appl. No.: 16/683,600

(22) Filed: Nov. 14, 2019

(65) Prior Publication Data

US 2020/0161151 A1 May 21, 2020

(30) Foreign Application Priority Data

Nov. 20, 2018 (JP) .............................. JP2018-217620

(51) Int. Cl.
*H01L 21/67* (2006.01)
*B28D 1/22* (2006.01)
(Continued)

(52) U.S. Cl.
CPC ........ *H01L 21/67092* (2013.01); *B23K 26/38* (2013.01); *B28D 1/22* (2013.01); *H01L 21/67242* (2013.01); *H01L 21/78* (2013.01); *H01L 23/544* (2013.01); *H01L 21/268* (2013.01); *H01L 21/304* (2013.01);
(Continued)

(58) Field of Classification Search
CPC ....... H01L 21/6836; H01L 2221/68331; H01L 23/544; H01L 2223/54486; H01L 2223/54453; H01L 2223/54426; H01L 2221/68327; H01L 21/6835; H01L 2223/5446; H01L 21/78; H01L 2221/6834; G03F 7/0002; B29C 59/026; B29C 59/02; B29C 59/022; B32B 38/06; B32B 3/30
See application file for complete search history.

(56) References Cited

U.S. PATENT DOCUMENTS 5,362,681 A * 11/1994 Roberts, Jr. .............. B28D 5/02
438/464
6,661,080 B1 * 12/2003 Glenn ................. H01L 21/6836
438/57

(Continued)

FOREIGN PATENT DOCUMENTS

JP 2007273546 A * 10/2007
JP 2009158648 A 7/2009
JP 2009253058 A * 10/2009

*Primary Examiner* — Alia Sabur
(74) *Attorney, Agent, or Firm* — Greer Burns & Crain Ltd.

(57) ABSTRACT

A workpiece processing method is provided for processing a workpiece including a device region, a peripheral surplus region surrounding the device region, and key patterns being arranged on a top surface side in the peripheral surplus region so as to correspond to a plurality of planned dividing lines, the method including: a resin sheet sticking step of sticking a resin sheet to the top surface side of the workpiece, and transferring the key patterns onto the resin sheet; a peripheral surplus region removing step of dividing the peripheral surplus region from the workpiece, and peeling off the peripheral surplus region from the resin sheet; and a device region processing step of identifying a position of at least one planned dividing line by using, as marks, traces of the key patterns exposed in the peripheral surplus region removing step, and processing the device region along the plurality of planned dividing lines.

3 Claims, 10 Drawing Sheets

(51) Int. Cl.
  *B23K 26/38*   (2014.01)
  *H01L 23/544*  (2006.01)
  *H01L 21/78*   (2006.01)
  *H01L 21/304*  (2006.01)
  *H01L 21/268*  (2006.01)

(52) U.S. Cl.
  CPC .............................. *H01L 21/3043* (2013.01); *H01L 2221/68327* (2013.01); *H01L 2221/68386* (2013.01); *H01L 2223/5446* (2013.01); *H01L 2223/54426* (2013.01); *H01L 2223/54453* (2013.01)

(56) References Cited

U.S. PATENT DOCUMENTS

| | | | |
|---|---|---|---|
| 2001/0055856 A1* | 12/2001 | Tao | H01L 23/49575 |
| | | | 257/E29.022 |
| 2015/0155205 A1* | 6/2015 | Iwasaki | H01L 21/78 |
| | | | 438/113 |
| 2016/0035635 A1* | 2/2016 | Tanaka | H01L 21/78 |
| | | | 438/7 |
| 2017/0221780 A1* | 8/2017 | Tanaka | H01L 22/20 |
| 2017/0287765 A1* | 10/2017 | Yoshihara | H01L 24/37 |
| 2018/0061711 A1* | 3/2018 | Yoshida | H01L 23/544 |

* cited by examiner

S10

WORKPIECE PROCESSING METHOD

BACKGROUND OF THE INVENTION

Field of the Invention

The present invention relates to a workpiece processing method that processes a workpiece along planned dividing lines.

Description of the Related Art

Cutting processing is known which cuts a workpiece such as a semiconductor wafer, a ceramic substrate, a resin package, or the like by a cutting apparatus having an annular cutting blade. The workpiece is cut along a path of movement of the cutting blade by moving the cutting blade and the workpiece relative to each other while making the cutting blade rotated at high speed cut along a planned dividing line of the workpiece. Further, laser processing is known which processes a workpiece by a laser irradiating apparatus. For example, a workpiece can be subjected to ablation processing by applying a laser beam of a wavelength absorbed by the workpiece along a planned dividing line. In the cutting processing and the laser processing described above, generally, a workpiece is disposed in an opening of an annular frame having the opening with a diameter larger than that of the workpiece, and an adhesive tape is affixed to the workpiece and the annular frame so as to close the opening. At this time, the undersurface side of the workpiece, for example, is affixed to the adhesive tape.

Then, a surface of the adhesive tape which surface is on an opposite side from a surface affixed to the workpiece and the annular frame is sucked and held by a holding surface of a chuck table provided to the cutting apparatus or the laser irradiating apparatus. Next, a characteristic pattern (that is, a key pattern) formed on the top surface side of the workpiece is imaged by an imaging apparatus such as a charge-coupled device (CCD) camera or the like that images a subject using visible light. The workpiece is then processed after the position of a planned dividing line is identified.

SUMMARY OF THE INVENTION

However, in the case where the top surface side of the workpiece is sucked and held by the holding surface, the key pattern cannot be recognized from the undersurface side of the workpiece by using visible light. There is accordingly a need to form a street identifying mark in a surplus region of the adhesive tape which surplus region does not overlap the workpiece, and image the street identifying mark by the imaging apparatus (see Japanese Patent Laid-Open No. 2009-158648, for example). In addition, there is a case of directly identifying the position of the key pattern on the top surface side from the undersurface side of the workpiece by an IR camera using infrared rays (IR) passing through a semiconductor wafer or the like in place of visible light. However, infrared rays cannot pass through a metal, a mold resin, or the like. Thus, in a case where a metallic layer is provided on the undersurface side of the workpiece, for example, it is necessary to partly remove the metallic layer, and form a through hole.

The present invention has been made in view of such problems, and it is an object of the present invention to provide a workpiece processing method that processes a workpiece after indirectly identifying the position of a key pattern on the top surface side of the workpiece from the undersurface side of the workpiece in a case where the top surface side of the workpiece on which the key pattern is formed is stuck to an adhesive tape.

In accordance with an aspect of the present invention, there is provided a workpiece processing method for processing a plate-shaped workpiece from an undersurface side of the workpiece, the workpiece including a device region having a device in each region demarcated by a plurality of planned dividing lines intersecting each other, a peripheral surplus region surrounding the device region, and key patterns having a recessed portion or a projecting portion, the key patterns being arranged on a top surface side of the workpiece in the peripheral surplus region so as to correspond to the plurality of planned dividing lines, the workpiece processing method including: a resin sheet sticking step of sticking a resin sheet to the top surface side of the workpiece, and transferring the key patterns onto the resin sheet; a peripheral surplus region removing step of dividing the peripheral surplus region from the workpiece, and peeling off the peripheral surplus region from the resin sheet; and a device region processing step of identifying a position of at least one planned dividing line among the plurality of planned dividing lines by using, as marks, traces of the key patterns in the peripheral surplus region exposed in the peripheral surplus region removing step, and processing the device region along the plurality of planned dividing lines.

Preferably, in the resin sheet sticking step, a frame unit including the workpiece, an annular frame, and the resin sheet is formed by disposing the annular frame so as to surround a periphery of the workpiece, and then sticking the resin sheet to the top surface side of the workpiece and the annular frame.

In addition, preferably, in the device region processing step, the workpiece is processed by cutting the workpiece with a cutting blade, or the workpiece is processed by irradiating the workpiece with a laser beam.

In the workpiece processing method according to one mode of the present invention, the key patterns having a recessed portion or a projecting portion, the key patterns being arranged so as to correspond to the plurality of planned dividing lines, are arranged in the peripheral surplus region on the top surface side of the workpiece, and the key patterns are transferred onto the resin sheet through the resin sheet sticking step. When the peripheral surplus region is then removed in the peripheral surplus region removing step, traces of the key patterns transferred onto the resin sheet are exposed on the resin sheet. Thus, the positions of the planned dividing lines can be identified with the traces as marks. It is therefore possible to process the workpiece after indirectly identifying the positions of the key patterns without imaging the key patterns via through holes or without forming marks, holes, or the like on an adhesive tape, the marks being formed as street identifying marks by using a marker.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
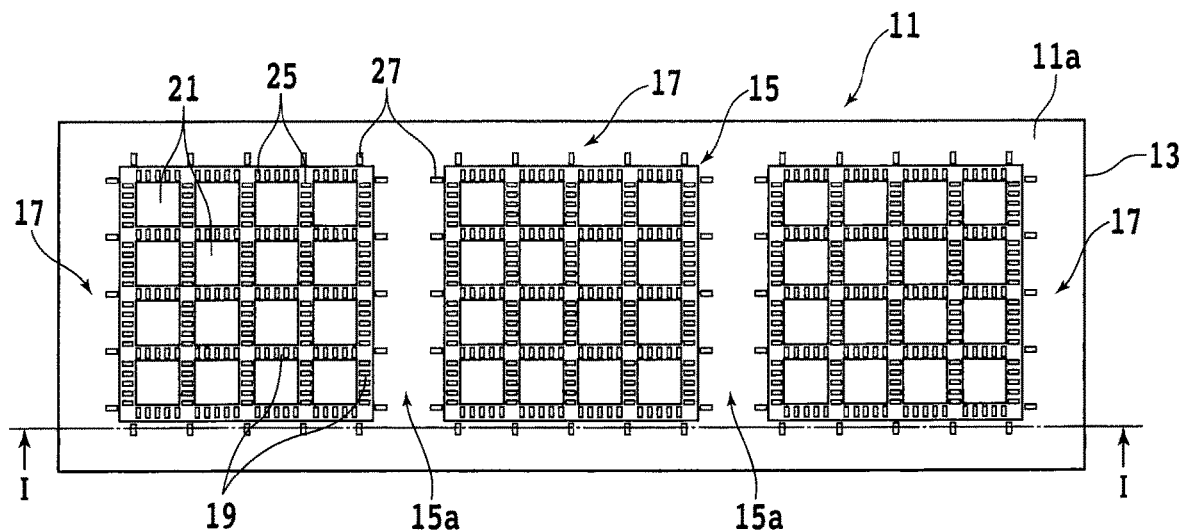
FIG. 1A is a top view of a resin package substrate.
Figure 1B:
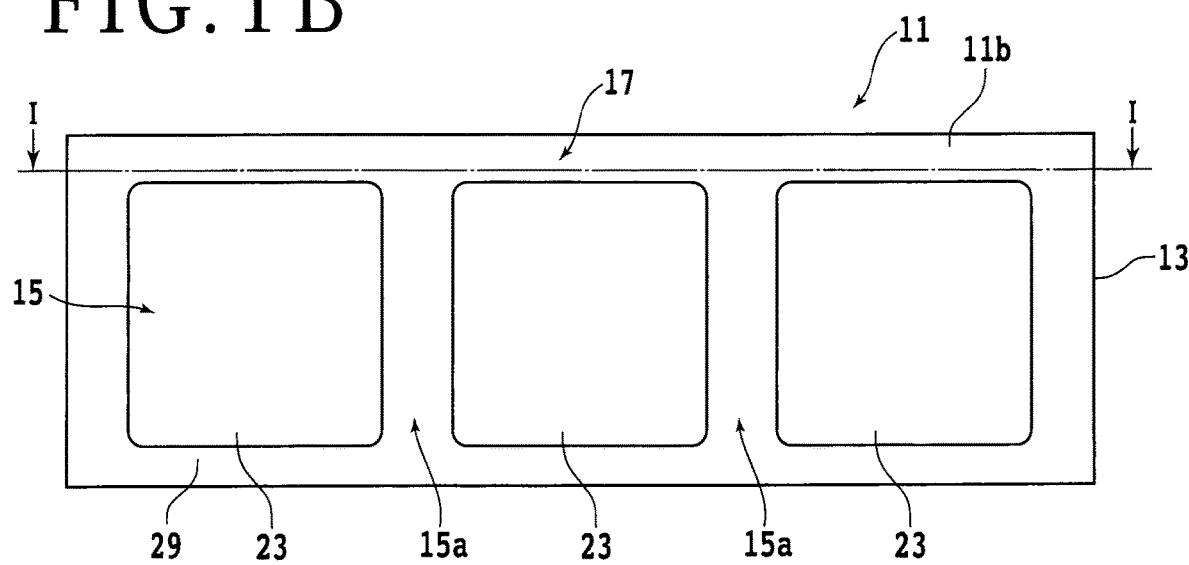
FIG. 1B is a bottom view of the resin package substrate.
Figure 1C:
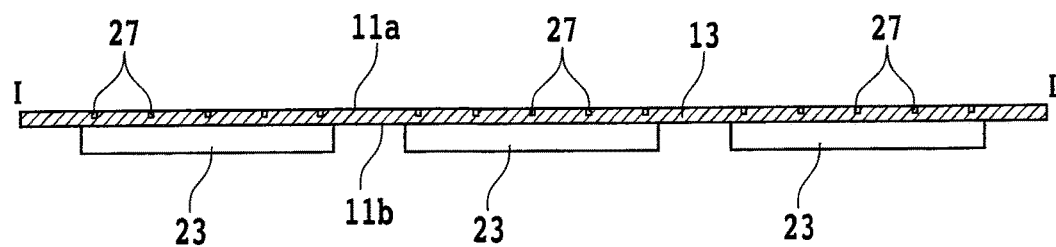
FIG. 1C is a sectional view taken along a line I-I of FIG. 1A and FIG. 1B.

An embodiment according to one mode of the present invention will be described with reference to the accompanying drawings. Description will first be made of a plate-shaped resin package substrate 11 (workpiece) according to the first embodiment. FIG. 1A is a top view of the resin package substrate 11. FIG. 1B is a bottom view of the resin package substrate 11. FIG. 1C is a sectional view taken along a line I-I of FIG. 1A and FIG. 1B. The resin package substrate 11 includes a flat plate-shaped substrate 13 including a metal such as copper (Cu) or the like. As illustrated in FIG. 1A, a plurality of device regions 15 (three device regions 15 in the first embodiment) are formed on a top surface side of the substrate 13 (that is, a top surface 11a side of the resin package substrate 11). The three device regions 15 are arranged apart from each other in a linear manner. Incidentally, a region between two device regions 15 in the resin package substrate 11 will be referred to as an intermediate region 15a, and a region surrounding one whole region including the three device regions 15 and two intermediate regions 15a will be referred to as a peripheral surplus region 17.

Each device region 15 is divided into a plurality of regions in a lattice manner by a plurality of planned dividing lines 19 intersecting one another. A stage 21 is formed in each of the regions. A device chip (not illustrated) in which a device such as an integrated circuit (IC) or the like is formed is disposed on an undersurface side of each stage 21 (that is, an undersurface 11b side of the resin package substrate 11). A plurality of electrode patterns 25 are arranged on the periphery of each stage 21. The electrode patterns 25 have a rectangular shape respectively, and are arranged apart from each other along the planned dividing lines 19. In the first embodiment, five electrode patterns 25 are arranged for each side of the stage 21 which side is along a planned dividing line 19. The electrode patterns 25 are exposed on the top surface 11a, and have a recessed portion recessed by a few micrometers with respect to the top surface of the substrate 13. However, the electrode patterns 25 may have a projecting portion projecting with respect to the top surface of the substrate 13, or may have a combination of a recessed portion and a projecting portion.

The undersurface 11b side of an electrode pattern 25 is connected to electrodes of device chips via a metallic wire (not illustrated) or the like. An electrode of a device chip disposed on one side of two stages 21 adjacent to each other with the electrode pattern 25 interposed therebetween is connected to one end of the undersurface 11b side of the electrode pattern 25. In addition, an electrode of a device chip disposed on the other side of the two stages 21 is connected to another end of the undersurface 11b side of the electrode pattern 25. When the resin package substrate 11 is cut along the planned dividing lines 19, this electrode pattern 25 is also divided. The electrode pattern 25 after being divided becomes an electrode of each packaged device.

Key patterns 27 (referred to also as target patterns or alignment marks) as a plurality of metallic patterns each having the same shape as the electrode patterns 25 are arranged on the periphery of each of the device regions 15. Each key pattern 27 is exposed on the top surface 11a side, and is disposed so as to correspond to a planned dividing line 19. In the first embodiment, two key patterns 27 are arranged on an extension of one planned dividing line 19 so as to sandwich one device region 15. A shortest distance from a position as a reference of a key pattern 27 (one side parallel with a planned dividing line 19, for example) to a center line of the planned dividing line 19 is determined in advance. Hence, a coordinate position of the center line of the planned dividing line 19 is identified by identifying a coordinate position of the position as a reference of the key pattern 27.

As with the electrode patterns 25, the key patterns 27 have a recessed portion recessed by a few micrometers (1 to 9 μm, for example) with respect to the top surface of the substrate 13. However, the key patterns 27 may have a projecting portion projecting with respect to the top surface of the substrate 13, or may have a combination of a recessed portion and a projecting portion. As illustrated in FIG. 1B, three mold resin layers 23 are formed on regions on the undersurface 11b side of the resin package substrate 11 which regions correspond to the device regions 15. Device chips respectively arranged on the undersurface sides of sixteen stages 21 are sealed in each of the mold resin layers 23 in the first embodiment.

Next, with reference to FIG. 2, FIG. 3A, FIG. 3B, FIG. 4A, FIG. 4B, and FIG. 5, description will be made of a processing method that cuts (processes) the resin package substrate 11 from the undersurface 11b side, and thereby divides the resin package substrate 11 into a plurality of packaged devices. In the first embodiment, first, an affixing apparatus (not illustrated) is used to stick a resin sheet 31 to the top surface 11a side of the resin package substrate 11, and transfer the key patterns 27 onto the resin sheet 31 (resin sheet sticking step (S10)). The resin sheet 31 in the first embodiment includes a base material layer including a resin which base material layer has a larger diameter than the resin package substrate 11. The base material layer, for example, has a thickness of 5 μm to 200 μm both inclusive, and includes a polymeric material such as polyolefin (PO), polyvinyl chloride (PVC), polystyrene (PS), polyethylene terephthalate (PET), or the like. An adhesive layer is provided to one surface of the base material layer. The adhesive layer is a layer of an adhesive including a resin that has an adhesive force but which is cured and decreased in the adhesive force when an external stimulus such as heat, ultraviolet light, or the like is given. The adhesive layer is, for example, provided on an entire surface of the base material layer.

In the resin sheet sticking step (S10), an affixing apparatus (not illustrated) is used to affix the resin sheet 31 to the top surface 11a of the resin package substrate 11. The affixing apparatus has a support table (not illustrated) supporting the resin package substrate 11. The support table is configured to be movable along a predetermined direction. A cylindrical pressurizing roller (not illustrated) that presses another surface of the base material layer which surface is located on an opposite side from the adhesive layer toward the support table is disposed above the support table. In the resin sheet sticking step (S10), an annular frame 33 including a metal which annular frame has an opening portion 33a of a larger diameter than the resin package substrate 11 is disposed on the support table. Next, the resin package substrate 11 is disposed in the opening portion 33a of the annular frame 33 such that the top surface 11a side of the resin package substrate 11 faces upward. The periphery of the resin package substrate 11 is consequently surrounded by the annular frame 33.

Figure 2:
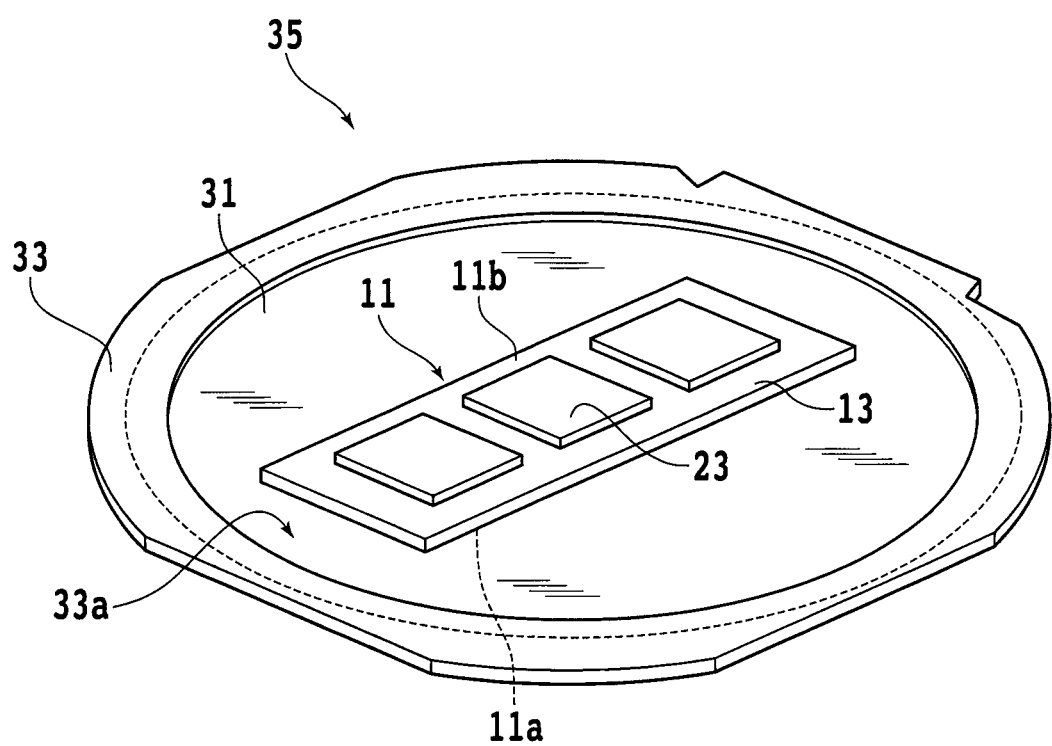
FIG. 2 is a perspective view of a frame unit after a resin sheet sticking step.

Next, the support table and the pressurizing roller are moved relative to each other in a state in which the resin sheet 31 is interposed between the pressurizing roller and the resin package substrate 11 and the annular frame 33 such that the base material layer faces the pressurizing roller and the adhesive layer faces the resin package substrate 11. The resin sheet 31 sticks to the top surface 11a of the resin package substrate 11 and one surface of the annular frame 33. That is, the resin sheet 31 is affixed to the annular frame 33 so as to close the opening portion 33a of the annular frame 33, and the resin sheet 31 is affixed to the top surface 11a side of the resin package substrate 11 disposed in the opening portion 33a. A frame unit 35 including the resin package substrate 11, the annular frame 33, and the resin sheet 31 is thereby formed. In addition, the key patterns 27 are transferred onto the resin sheet 31. FIG. 2 is a perspective view of the frame unit 35 after the resin sheet sticking step (S10). Incidentally, a broken line in FIG. 2 represents an external shape of the resin sheet 31.

As compared with a case where the resin package substrate 11 and the resin sheet 31 are integrated with each other without the use of the annular frame 33, the formation of the frame unit 35 makes it possible to integrally convey a plurality of device chips obtained by dividing the resin package substrate 11, and thus facilitates conveyance of the device chips. Incidentally, the resin sheet 31 may have only the base material layer without having the adhesive layer. In this case, in the resin sheet sticking step (S10), the pressurizing roller makes the resin sheet 31 stick to the top surface 11a of the resin package substrate 11 and one surface of the annular frame 33 while the resin sheet 31 is softened and deformed by heating the support table. Incidentally, a heating temperature may be adjusted as appropriate to be the softening point of each material according to the material for the resin sheet 31.

In addition, in place of the heating of the support table and the pressurization by the pressurizing roller, hot air may be blown onto the resin sheet 31. The resin sheet 31 can be pressed by air pressure against the top surface 11a of the resin package substrate 11 and one surface of the annular frame 33 while the resin sheet 31 is softened and deformed by the hot air. It is consequently possible to make the resin sheet 31 stick to the resin package substrate 11 and the like. After the resin sheet sticking step (S10), the peripheral surplus region 17 of the resin package substrate 11 is divided and removed from the resin package substrate 11 (peripheral surplus region removing step (S20)). In the peripheral surplus region removing step (S20), the peripheral surplus region 17 is cut by a cutting apparatus 40.

Figure 4A:
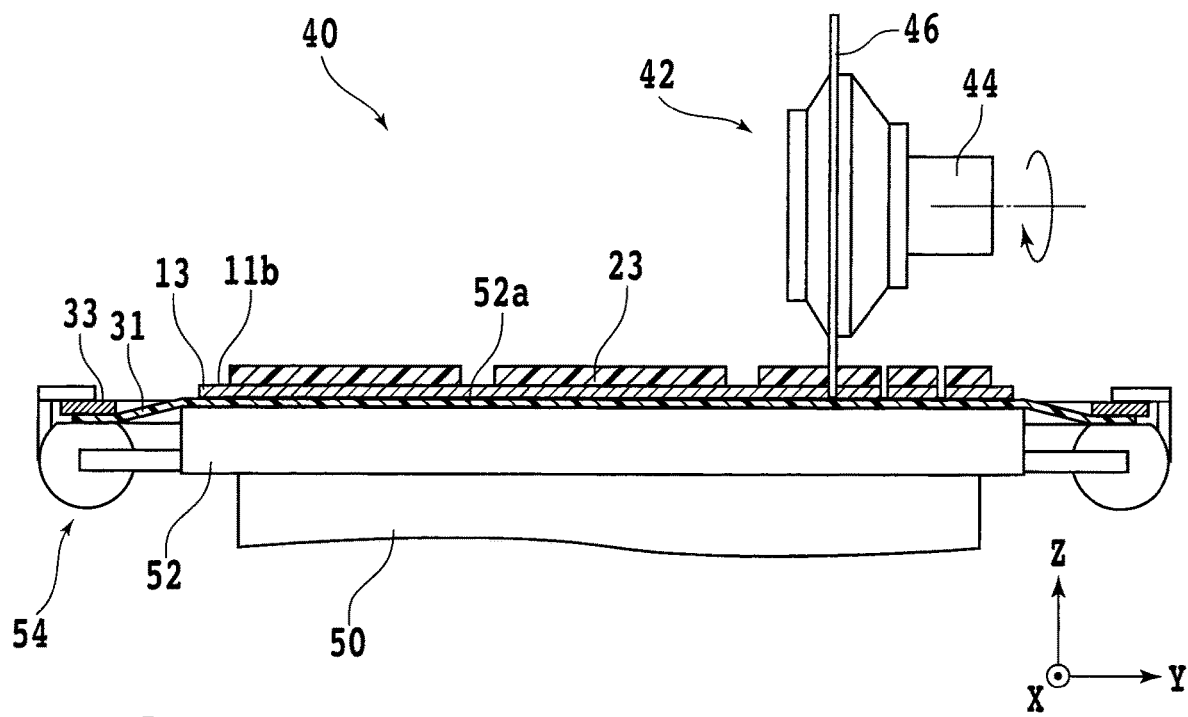
FIG. 4A is a partially sectional side view illustrating a device region processing step.

An outline of a structure of the cutting apparatus 40 will be described in the following with reference to FIG. 4A. The cutting apparatus 40 includes a cutting unit 42 that cuts the resin package substrate 11. The cutting unit 42 includes a spindle 44. A motor unit (not illustrated) that rotates the spindle 44 at high speed is coupled to one end of the spindle 44. An annular cutting blade 46 provided with a cutting edge on a periphery thereof is fitted to another end of the spindle 44. The cutting blade 46 is rotated at high speed by driving the motor unit. Incidentally, the cutting blade 46 may be a hub type, or may be a hubless type. The cutting apparatus 40 further includes a chuck table 52 that sucks and holds the frame unit 35.

The chuck table 52 has a porous plate (not illustrated) including a porous material. A suction source such as an ejector or the like is connected to the porous plate via a flow passage (not illustrated). Due to negative pressure from the suction source, a top surface of the porous plate functions as a holding surface 52a on which the negative pressure acts. In addition, the chuck table 52 is supported by a table base 50 so as to be rotatable such that a straight line passing through a center of the holding surface 52a and extending along a Z-axis direction is set as an axis of rotation of the chuck table 52, and so as to be slidingly movable in an X-axis direction (that is, a processing feed direction). Incidentally, an X-axis, a Y-axis, and a Z-axis are axes orthogonal to each other. A plurality of (four, for example) clamps 54 are provided to the chuck table 52 so as to project from a side portion of the chuck table 52 to the outside. The clamps 54 fix the annular frame 33 to the chuck table 52 by sandwiching the annular frame 33.

Figure 3A:
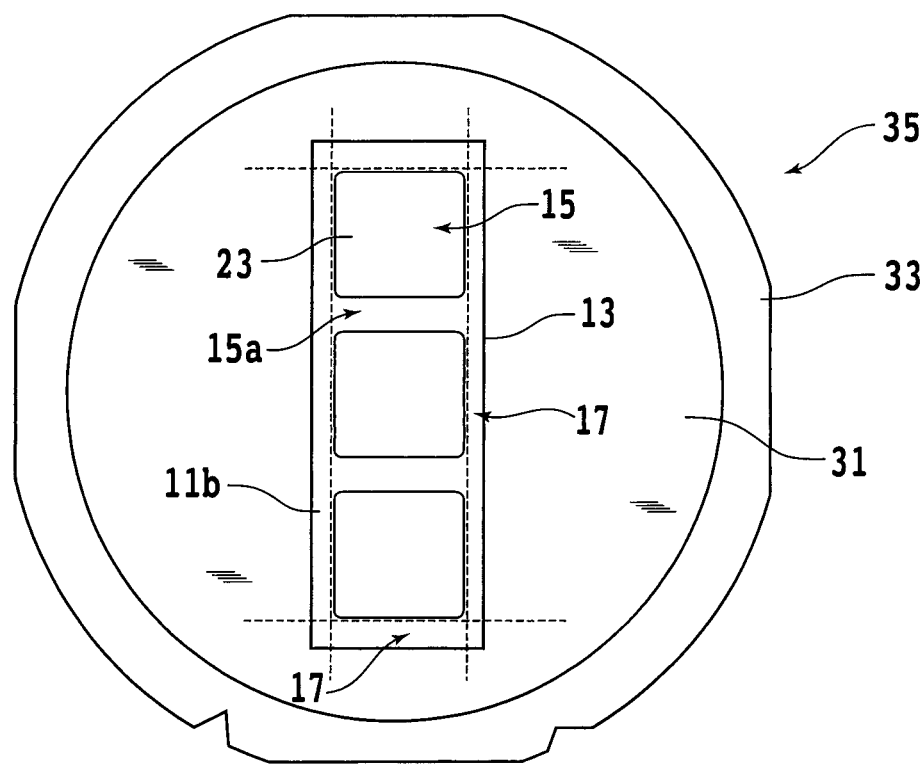
FIG. 3A is a top view illustrating a peripheral surplus region removing step.

Here, the description returns to the peripheral surplus region removing step (S20). FIG. 3A is a top view illustrating the peripheral surplus region removing step (S20). When the peripheral surplus region 17 is to be cut, the frame unit 35 is first mounted on the holding surface 52a such that the surface of the resin sheet 31 which surface is on an opposite side from the resin package substrate 11 is in contact with the holding surface 52a. Next, a negative pressure is made to act on the porous plate by actuating the suction source, so that the holding surface 52a sucks and holds the frame unit 35. Thereafter, while a cutting liquid such as pure water or the like is supplied to a processing point as a point of contact between the cutting blade 46 and the resin package substrate 11, the cutting blade 46 rotating at high speed is made to cut into the undersurface 11b side of the resin package substrate 11, and the cutting blade 46 and the chuck table 52 are moved relative to each other.

A cutting depth position of the cutting blade 46 cutting into the substrate 13 is adjusted to a predetermined depth such that the cutting blade 46 does not cut the resin sheet 31. Then, the substrate 13 of the resin package substrate 11 is cut along the outer peripheral edges of the mold resin layers 23 (indicated by broken lines in FIG. 3A).

The peripheral surplus region 17 is consequently divided from the resin package substrate 11. The frame unit 35 is thereafter moved to an ultraviolet irradiating apparatus (not illustrated). The ultraviolet irradiating apparatus has a transparent support table. A light source that applies ultraviolet rays is disposed under the support table. In addition, a mask layer defining a range of ultraviolet rays applied to the top surface 11a side of the resin package substrate 11 is disposed between the support table and the light source. The mask layer includes a metallic thin film of chromium (Cr) or the like having a light shielding property. The mask layer has an opening in a region corresponding to the peripheral surplus region 17, and covers a region corresponding to the device regions 15 and the intermediate regions 15a. Therefore, when ultraviolet rays are applied from the light source, the region corresponding to the peripheral surplus region 17 is irradiated with the ultraviolet rays, but the region corresponding to the device regions 15 and the intermediate regions 15a is not irradiated with the ultraviolet rays.

Because of a decrease in the adhesive force of the resin sheet 31 on the peripheral surplus region 17 irradiated with the ultraviolet rays, the divided peripheral surplus region 17 is easily peeled off from the resin sheet 31. The peripheral surplus region 17 is, for example, peeled off by a peeling apparatus not illustrated, but may be peeled off by a hand of a worker himself/herself. By thus removing most of the peripheral surplus region 17 including a metal before cutting the device regions 15, it is possible to suppress a decrease in cutting quality of the cutting blade 46 due to loading of abrasive grains of the cutting blade 46 during the cutting of the device regions 15. That is, a decrease in cutting efficiency can be suppressed.

Figure 3B:
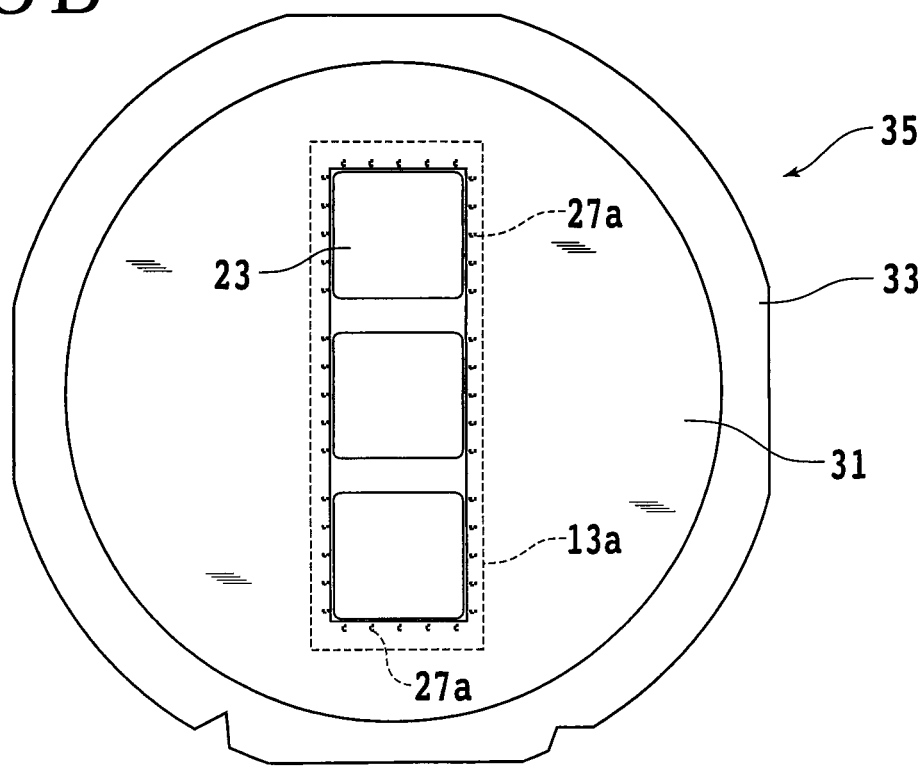
FIG. 3B is a top view of the frame unit after the peripheral surplus region removing step.

FIG. 3B is a top view of the frame unit 35 after the peripheral surplus region removing step (S20). A trace 13a indicating the external shape of the substrate 13 and traces 27a of the key patterns 27 located in the peripheral surplus region 17 are transferred onto the resin sheet 31 exposed in the peripheral surplus region removing step (S20). Incidentally, the traces 27a are formed in the resin sheet sticking step (S10). The traces 27a are a three-dimensional pattern formed by pressing the key patterns 27 against the resin sheet 31, and thereby causing plastic deformation of a part of the resin sheet 31 in contact with the key patterns 27. However, the traces 27a may be formed by solidifying a part of the resin sheet 31 (resin layer, for example) after the deformation by the irradiation with the ultraviolet rays in the peripheral surplus region removing step (S20). The traces 27a are stable, and do not disappear easily after passage of time. The traces 27a can therefore be used as marks at a time of identifying the positions of the planned dividing lines 19 on the top surface 11a side in a subsequent device region processing step (S30).

After the peripheral surplus region removing step (S20), the device regions 15 are cut from the undersurface 11b side along the planned dividing lines 19 (device region processing step (S30)). The device region processing step (S30) also uses the above-described cutting apparatus 40, and therefore repeated description of the cutting apparatus 40 will be omitted. Incidentally, a cutting blade 46 suitable for cutting the resin package substrate 11 and different from the cutting blade 46 used in the peripheral surplus region removing step (S20) may be used in the device region processing step (S30). In addition, one cutting unit 42 of a so-called dual dicer may be used in the peripheral surplus region removing step (S20), and another cutting unit 42 of the dual dicer may be used in the device region processing step (S30).

In the device region processing step (S30), first, an imaging apparatus provided to the cutting apparatus 40 images the upper surface of the resin sheet 31. The imaging apparatus is, for example, a CCD camera that images a subject using visible light. However, the imaging apparatus may be another camera such as a complementary metal oxide semiconductor (CMOS) camera or the like. After the imaging, the positions of the planned dividing lines 19 on the undersurface 11b side are identified from the traces 27a on the resin sheet 31 by using a technology of image processing such as pattern matching or the like. For example, because the shape of the key patterns 27 is directly reflected in the traces 27a on the resin sheet 31, the coordinate positions of the center lines of the planned dividing lines 19 are identified from the reference coordinate positions of the traces 27a in an image after the image processing.

Next, the cutting unit 42 and the chuck table 52 are aligned in the X-axis direction and the Y-axis direction, and the position of the cutting blade 46 is set on the center line of one planned dividing line 19 (that is, alignment is performed). Then, while a cutting liquid such as pure water or the like is supplied, the cutting blade 46 is made to cut into the undersurface 11b side of the resin package substrate 11, and the cutting blade 46 and the chuck table 52 are moved relative to each other along the processing feed direction. The resin package substrate 11 is thereby cut as indicated by cutting lines 47 (see FIG. 4B). For example, a device region 15 is cut along one planned dividing line 19 parallel with one direction, the chuck table 52 is then moved in an indexing feed direction by a predetermined distance, and the device region 15 is similarly cut along another planned dividing line 19 parallel with the one direction.

Incidentally, the imaging of the traces 27a may also be performed while the cutting is performed, and an amount of displacement of +Δ μm between the position of the cutting blade 46 and the position of the center line of the planned dividing line 19 may be detected. The detected displacement of ±Δ μm is eliminated when the chuck table 52 is moved in the indexing feed direction. For example, when the chuck table 52 is moved in the indexing feed direction by 5000 μm, the displacement of ±Δμm is eliminated by moving the chuck table 52 by Numerical Expression 1.

$$5000 \mp \Delta \mu m \qquad \text{[Expression 1]}$$

The device regions 15 are thus cut along all of the planned dividing lines 19 parallel with the one direction. Next, the chuck table 52 is rotated by 90 degrees, and the device regions 15 are cut along all of the planned dividing lines 19 parallel with another direction orthogonal to the one direction. Thus, the division along the planned dividing lines 19 is possible even when the key patterns 27 are not present on the top surface 11a.

Figure 4B:
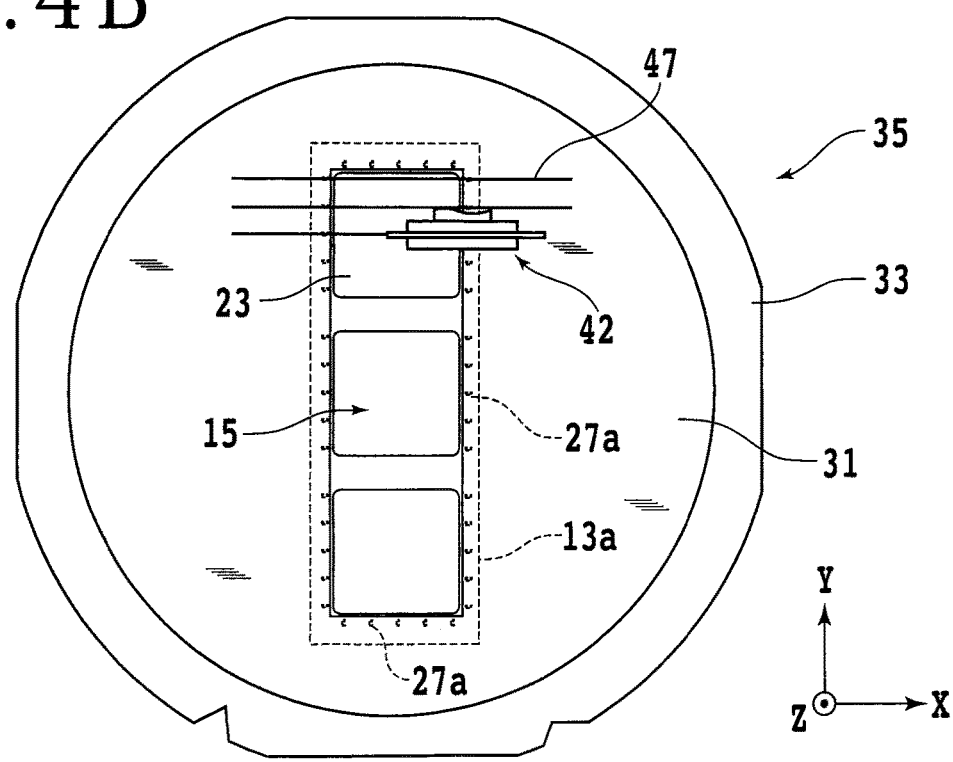
FIG. 4B is a top view illustrating the device region processing step.
Figure 5:
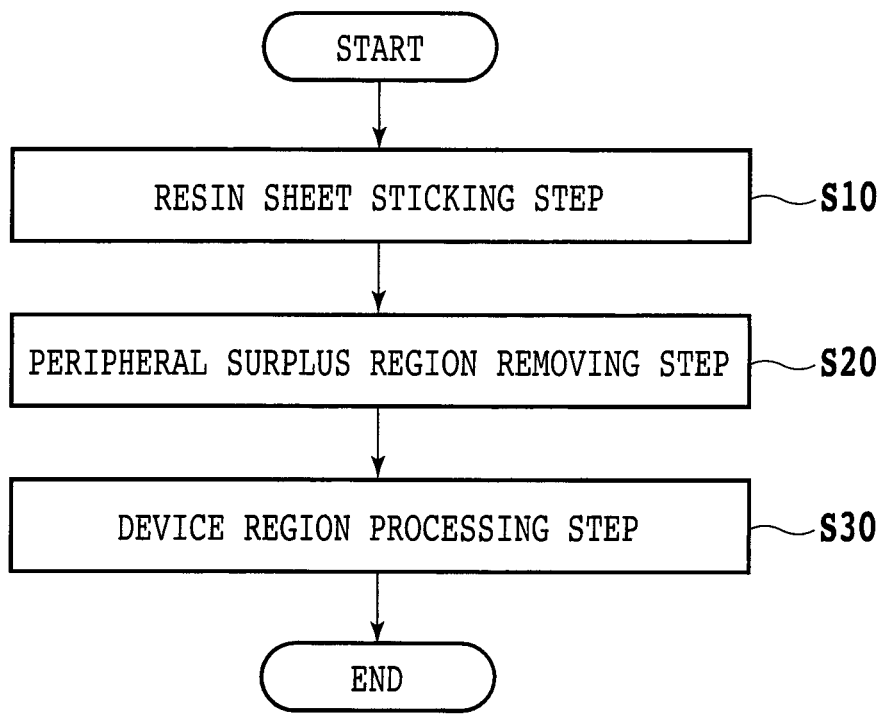
FIG. 5 is a flowchart illustrating a method of processing the resin package substrate.

After an end of the device region processing step (S30), the frame unit 35 is moved from the cutting apparatus 40 to the ultraviolet irradiating apparatus (not illustrated). Then, the whole of the resin sheet 31 located in the opening portion 33a is irradiated with ultraviolet rays to decrease the adhesive force of the resin sheet 31. Next, a plurality of divided packaged devices are extracted from the chuck table 52. FIG. 4A is a partially sectional side view illustrating the device region processing step (S30). FIG. 4B is a top view illustrating the device region processing step (S30). FIG. 5 is a flowchart illustrating a method of processing the resin package substrate 11.

Incidentally, in a first modification of the first embodiment, the area of the key patterns 27 is made larger than that of the electrode patterns 25. This facilitates identification of the traces 27a in an image obtained by imaging the resin sheet 31 onto which the traces 27a are transferred, and thus improves work efficiency of the device region processing step (S30). In addition, in a second modification of the first embodiment, the intermediate regions 15a may be removed in the peripheral surplus region removing step (S20). The traces 27a of the key patterns 27 located in the intermediate regions 15a can therefore be used as marks when the positions of the planned dividing lines 19 are identified. Consequently, processing accuracy can be improved more.

Figure 6A:
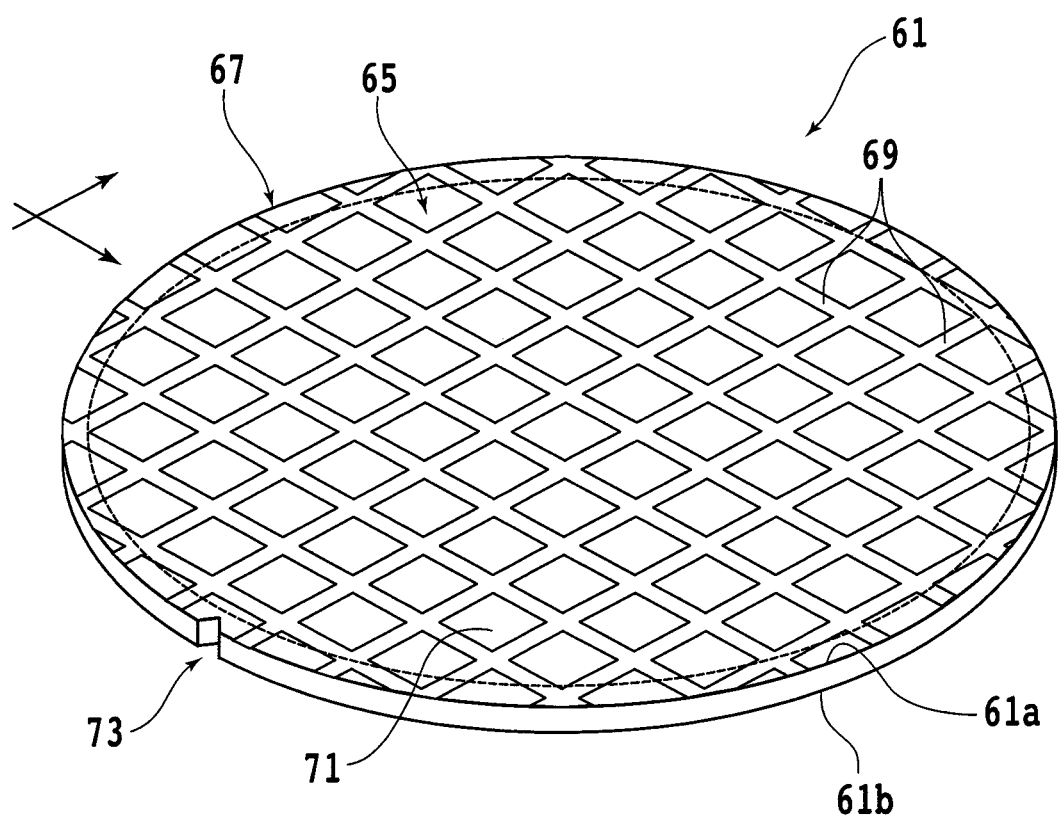
FIG. 6A is a perspective view of a top surface side of a wafer.
Figure 6B:
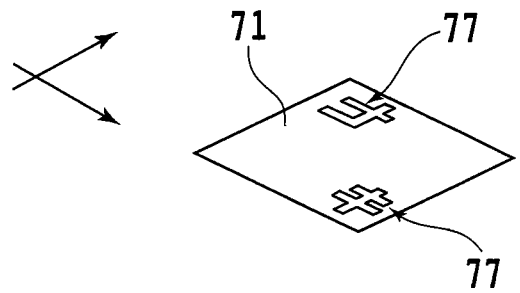
FIG. 6B is an enlarged view of a top surface side of one device in a device region.

A second embodiment will next be described. A plate-shaped workpiece according to the second embodiment is a wafer 61 mainly including a semiconductor. FIG. 6A is a perspective view of a top surface 61a side of the wafer 61. The wafer 61 includes a device region 65. The device region 65 is divided into a plurality of regions by a plurality of planned dividing lines 69 intersecting each other. A device 71 is formed in each of the regions. FIG. 6B is an enlarged view of the top surface 61a side of one device 71 in the device region 65. The wafer 61 has a peripheral surplus region 67 surrounding the outside of the device region 65. Incidentally, the peripheral surplus region 67 is also demarcated into a plurality of regions by the plurality of planned dividing lines 69. Formed in each of the regions is a pattern of a minute structure that is similar to the device 71 located in the device region 65 but is incomplete as a circuit. In FIG. 6A, a broken line indicates a boundary between the device region 65 and the peripheral surplus region 67.

As illustrated in FIG. 6B, key patterns 77 (referred to also as target patterns or alignment marks) having a recessed portion or a projecting portion of a metallic pattern are provided on the top surface 61a side of the device 71. Key patterns 77 are also provided in each region straddling the device region 65 and the peripheral surplus region 67 (that is, each region divided by the plurality of planned dividing lines 69) as in the device 71. The key patterns 77 are used as marks when the positions of the planned dividing lines 69 are identified later. In addition, the key patterns 77 are basically provided also in each region located in the peripheral surplus region 67 (that is, each region divided by the plurality of planned dividing lines 69) as in the device 71. However, because each region in the peripheral surplus region 67 is partially missing due to the shape of the wafer 61, no key patterns 77 are provided in regions in which the positions of the key patterns 77 are located outside the peripheral edge portion of the wafer 61. However, there is no problem in identifying the positions of the planned dividing lines 69 even when the key patterns 77 are not provided in all of regions in the peripheral surplus region 67.

The key patterns 77 are exposed on a topmost surface of a functional layer including a metallic layer and an insulating layer formed of a low dielectric constant (Low-k) material or the like. The key patterns 77 are, for example, a part of the metallic layer exposed on the topmost surface by partially removing the insulating layer located on the topmost surface of the functional layer. That is, the key patterns 77 have a recessed portion recessed by a few micrometers with respect to the top surface 61a of the wafer 61. However, as in the first embodiment, the key patterns 77 may have a projecting portion projecting from the top surface 61a of the wafer 61, or may have a combination of a recessed portion and a projecting portion. In addition, the key patterns 77 may include the insulating layer of the functional layer. In FIG. 6B, two key patterns 77 having patterns different from each other are formed on a diagonal line of a rectangular region located on the top surface 61a side of one device 71. However, the number, shape, arrangement, and the like of the key patterns 77 are not limited to the present example. The key patterns 77 are arranged at predetermined positions on the top surface 61a side of each device 71.

Also in the second embodiment, a shortest distance from one side of a key pattern 77 which side is parallel with a planned dividing line 69 to the center line of the planned dividing line 69 adjacent to the key pattern 77 is determined in advance. Incidentally, the position of the key pattern 77 is determined in advance not only with respect to the nearest planned dividing line 69 but also with respect to a second nearest planned dividing line 69 or a third nearest planned dividing line 69. The key patterns 77 are thus provided in correspondence with the plurality of planned dividing lines 69. Also in the second embodiment, as in the first embodiment, the key patterns 77 in the peripheral surplus region 67 are transferred onto a resin sheet 31 through the resin sheet sticking step (S10). The key patterns 77 can therefore be used to identify the positions of the planned dividing lines 69. Incidentally, a notch 73 indicating the crystal orientation of the wafer 61 is formed in the outer circumferential side surface of the wafer 61. However, an orientation flat (OF) may be formed in place of the notch 73.

Figure 7A:
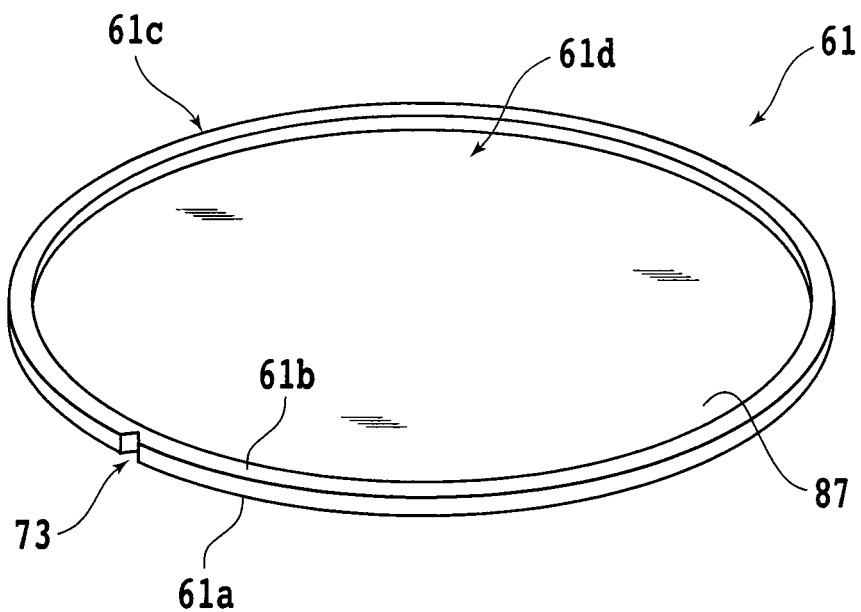
FIG. 7A is a perspective view of an undersurface side of the wafer.

Description will next be made of an undersurface 61b side of the wafer 61. FIG. 7A is a perspective view of the undersurface 61b side of the wafer 61. A recessed portion formed by a disk-shaped space is formed on the undersurface 61b side of the wafer 61 through an undersurface grinding technology referred to as a TAIKO (registered trademark) process. As illustrated in FIG. 7A, an annular portion 61c is formed with a predetermined width (2 mm to 5 mm, for example) from the outer circumference of the wafer 61. In addition, a disk portion 61d is formed on the inside of the annular portion 61c. The annular portion 61c substantially corresponds to the range of the peripheral surplus region 67 on the top surface 61a side. The inner peripheral side surface of the annular portion 61c may be located on the outside of the boundary between the device region 65 and the peripheral surplus region 67, or may be positioned on the inside of the boundary.

The annular portion 61c has the thickness of the wafer 61 before the TAIKO process. On the other hand, in the disk portion 61d, the undersurface 61b side is ground by the TAIKO process, and the thickness of the wafer 61 is reduced from the thickness before the TAIKO process. The annular portion 61c has a large thickness and high stiffness as compared with the disk portion 61d. Thus, as compared with a case where the whole of the wafer 61 is made to have the same thickness as the disk portion 61d, warps, cracks, damage, and the like in the wafer 61 can be reduced. Incidentally, a metallic film 87 (see FIG. 7B and FIG. 8) including copper or the like is formed on the undersurface 61b side of the disk portion 61d. The metallic film 87 is, for example, used as a heat radiating plate for releasing heat generated in device chips to the outside after the wafer 61 is divided into the plurality of device chips.

Next, with reference to FIG. 7B, FIG. 8, FIG. 9A, FIG. 9B, and FIG. 10, description will be made of a method of processing the wafer 61 which method divides the wafer 61 into a plurality of device chips. In the second embodiment, first, the above-described affixing apparatus (not illustrated) is used to stick the resin sheet 31 to the wafer 61 and an annular frame 33, and transfers the key patterns 77 onto the resin sheet 31 (resin sheet sticking step (S10)). The resin sheet 31, the annular frame 33, and the affixing apparatus (not illustrated) are the same as in the first embodiment, and therefore description thereof will be omitted. In the resin sheet sticking step (S10), the annular frame 33 is disposed on the support table. Next, the wafer 61 is disposed in the opening portion 33a of the annular frame 33 such that the top surface 61a side of the wafer 61 faces upward. The periphery of the wafer 61 is consequently surrounded by the annular frame 33.

The support table and the pressurizing roller are thereafter moved relative to each other in a state in which the resin sheet 31 is interposed between the pressurizing roller and the annular frame 33 and the wafer 61 such that the base material layer of the resin sheet 31 faces the pressurizing roller and the adhesive layer of the resin sheet 31 faces the wafer 61. The resin sheet 31 sticks to the top surface 61a of the wafer 61 and one surface of the annular frame 33. That is, the resin sheet 31 is affixed to the annular frame 33 so as to close the opening portion 33a of the annular frame 33, and the resin sheet 31 is affixed to the top surface 61a side of the wafer 61 disposed in the opening portion 33a. Consequently, a frame unit 85 including the wafer 61, the resin sheet 31, and the annular frame 33 is formed, and the key patterns 77 are transferred onto the resin sheet 31. As compared with a case where the wafer 61 and the resin sheet 31 are integrated with each other without the use of the annular frame 33, the formation of the frame unit 85 more facilitates conveyance and the like of the wafer 61 provided with the resin sheet 31.

Figure 7B:
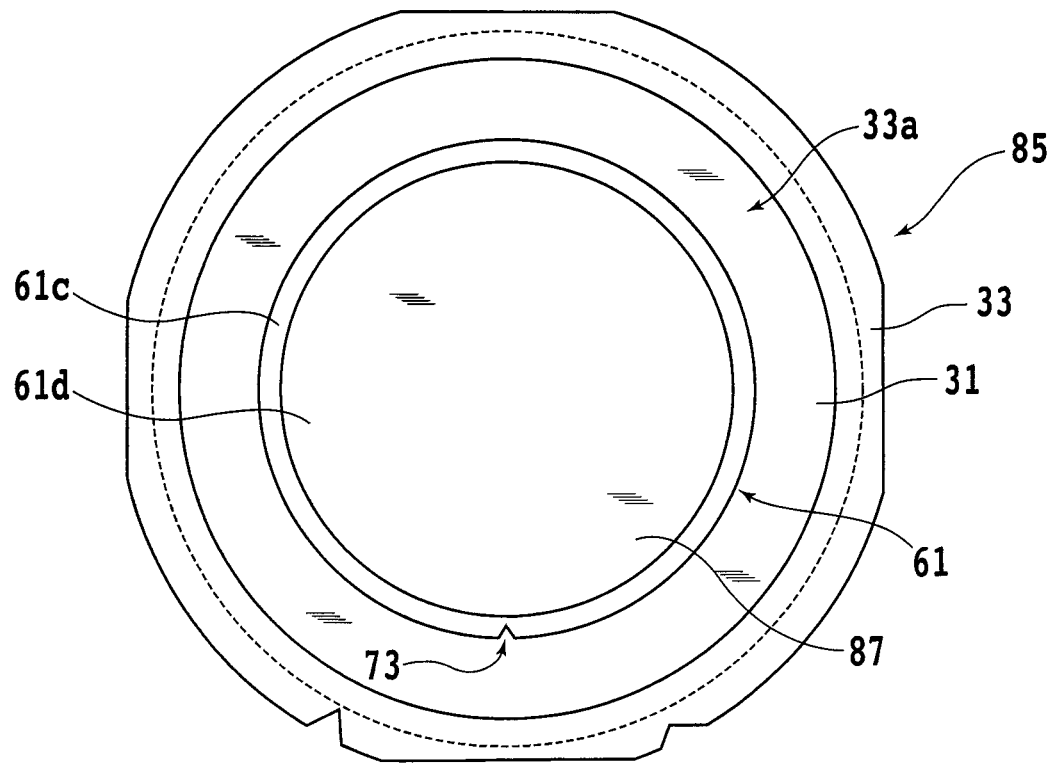
FIG. 7B is a top view of a frame unit formed in a resin sheet sticking step.
Figure 8:
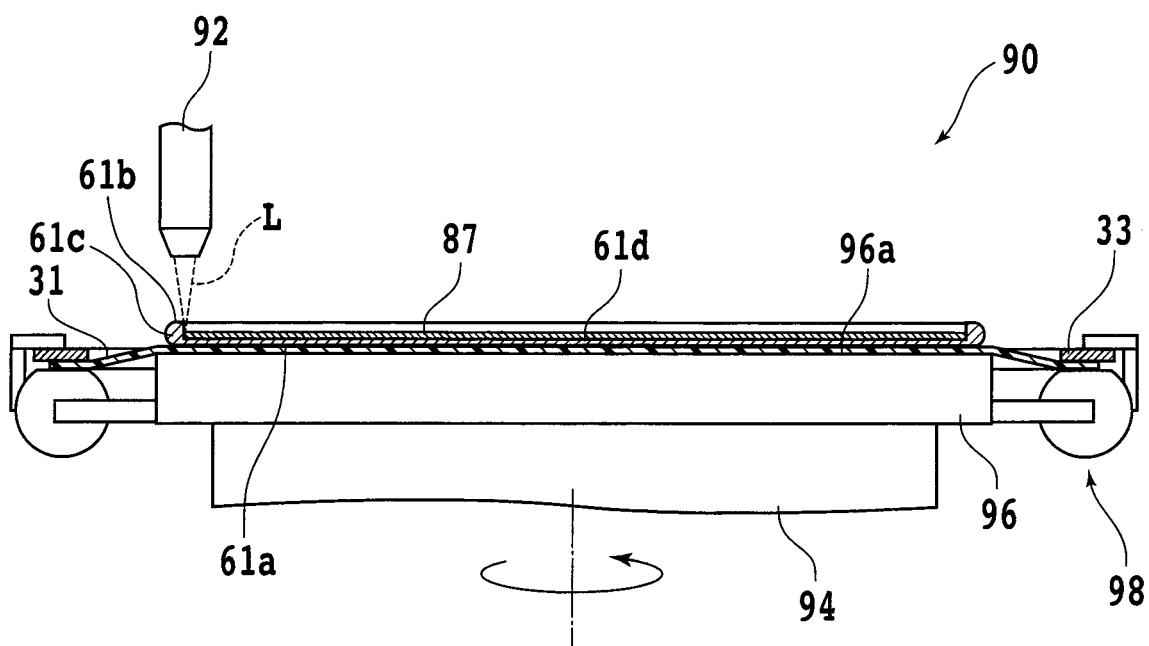
FIG. 8 is a partially sectional side view illustrating a peripheral surplus region removing step.

FIG. 7B is a top view of the frame unit 85 formed in the resin sheet sticking step (S10). A broken line in FIG. 7B represents an external shape of the resin sheet 31. Incidentally, as in the first embodiment, the resin sheet 31 may have only the base material layer without having the adhesive layer. After the resin sheet sticking step (S10), a laser processing apparatus 90 is used to remove the annular portion 61c by irradiating an annular region of the disk portion 61d located on the inside of the annular portion 61c with a laser beam L from the undersurface 61b side of the wafer 61 (peripheral surplus region removing step (S20)). FIG. 8 is a partially sectional side view illustrating the peripheral surplus region removing step (S20). The laser processing apparatus 90 includes a table base 94, a chuck table 96, and a clamp 98. However, the table base 94, the chuck table 96, and the clamp 98 correspond to the table base 50, the chuck table 52, and the clamp 54 of the cutting apparatus 40, and therefore description thereof will be omitted.

The laser processing apparatus 90 further includes a laser processing head 92 that applies the laser beam L of a wavelength absorbed by the wafer 61. The laser beam L is, for example, a pulsed laser beam having a wavelength (355 nm, for example) of ultraviolet rays. The laser beam L is generated by a laser oscillator (not illustrated), and is applied from the laser processing head 92 to the wafer 61. In the peripheral surplus region removing step (S20), first, the frame unit 85 is mounted on a holding surface 96a such that the surface of the resin sheet 31 which surface is on an opposite side from the wafer 61 is in contact with the holding surface 96a of the chuck table 96. Next, a suction source is actuated, so that the holding surface 96a sucks and holds the frame unit 35. Thereafter, the chuck table 96 is rotated in a state in which the position of a spot of the laser beam L is set on a boundary portion between the annular portion 61c and the disk portion 61d. Consequently, the boundary portion is subjected to ablation processing in a circular manner, and the annular portion 61c (that is, the peripheral surplus region 67) is divided from the wafer 61.

Figure 9A:
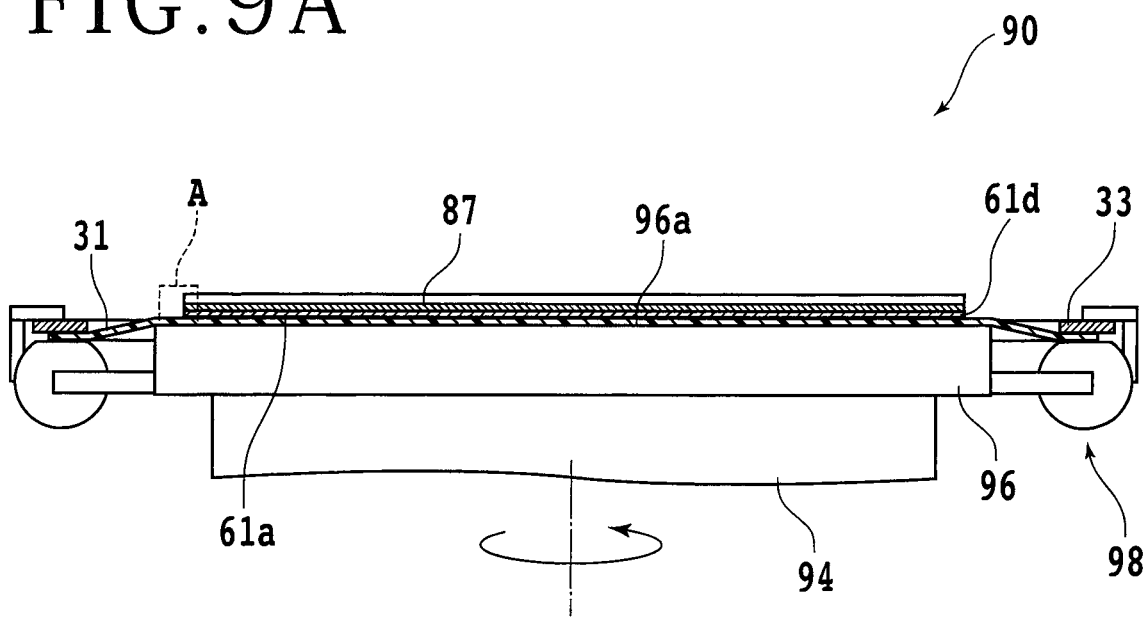
FIG. 9A is a partially sectional side view of the wafer and the like after the peripheral surplus region removing step.
Figure 9A:
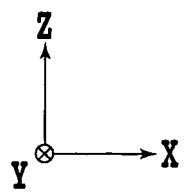
Figure 9B:
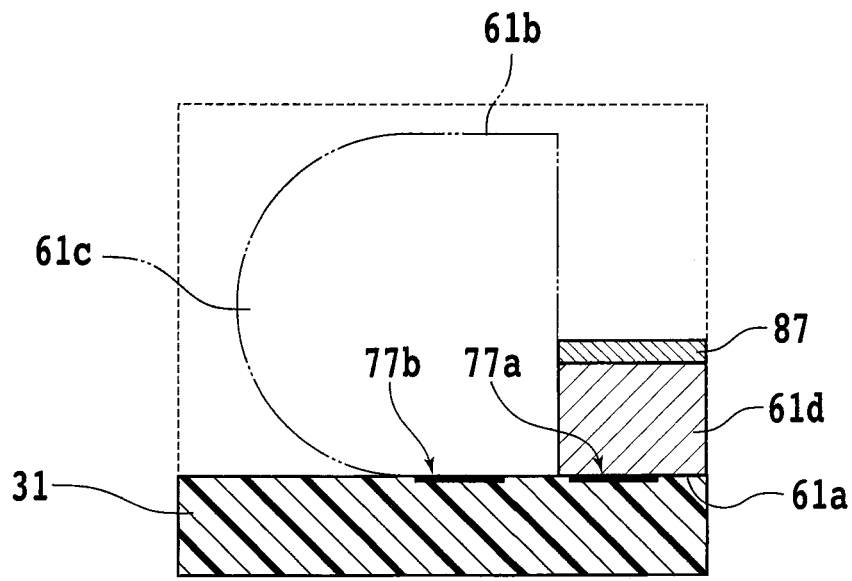
FIG. 9B is an enlarged view of a region A in FIG. 9A.

Next, only the divided peripheral surplus region 67 is irradiated with ultraviolet rays by using the support table provided with the mask layer described above. The peripheral surplus region 67 is thereafter peeled off and removed from the resin sheet 31. As in the first embodiment, the peripheral surplus region 67 may be peeled off by a peeling apparatus not illustrated, or may be peeled off by a hand of a worker himself/herself. FIG. 9A is a partially sectional side view of the wafer 61 and the like after the peripheral surplus region removing step (S20). FIG. 9B is an enlarged view of a region A in FIG. 9A. Incidentally, in FIG. 9B, the annular portion 61c before being removed is indicated by a broken line.

As described above, key patterns 77 are provided on the top surface 61a side of the devices 71 in the device region 65 and the peripheral surplus region 67. As illustrated in FIG. 9B, a key pattern 77 in the device region 65 is transferred as a trace 77a onto the resin sheet 31, and a key pattern 77 in the peripheral surplus region 67 is transferred as a trace 77b onto the resin sheet 31. As with the above-described traces 27a, the traces 77a and 77b are formed in the resin sheet sticking step (S10). The traces 77a and 77b are a three-dimensional pattern formed by plastic deformation or the like of a part of the resin sheet 31 in contact with the key patterns 77. The traces 77a and 77b do not disappear after passage of time. Incidentally, the traces 77a and 77b may be formed by solidifying a part of the resin sheet 31 (resin layer, for example) after the deformation by the irradiation with the ultraviolet rays in the peripheral surplus region removing step (S20). The trace 77b is used as a mark at a time of identifying the positions of the planned dividing lines 69 in a subsequent device region processing step (S30).

After the peripheral surplus region removing step (S20), the device region 65 is processed along the planned dividing lines 69 by applying the laser beam L from the undersurface 61b side (device region processing step (S30)). In the device region processing step (S30) according to the second embodiment, the device region 65 is subjected to ablation processing by using the above-described laser beam L. In the device region processing step (S30), first, an imaging apparatus provided to the laser processing apparatus 90 images the upper surface of the resin sheet 31. The imaging apparatus is, for example, a CCD camera that images a subject using visible light. However, the imaging apparatus may be another camera such as a CMOS camera or the like. Then, the positions of the planned dividing lines 69 on the undersurface 61b side are identified from the traces 77b on the resin sheet 31 by using a technology of image processing such as pattern matching or the like. For example, on the top surface 61a of the wafer 61, a shortest distance from a position as a reference of a key pattern 77 (one side parallel with a planned dividing line 19, for example) to a center line of the planned dividing line 69 is determined in advance, and the shape of the key pattern 77 is directly reflected in the trace 77b on the resin sheet 31. Thus, the coordinate position of the center line of the planned dividing line 69 can be identified from the coordinate position of the trace 77b by using image processing.

Next, the laser processing head 92 and the chuck table 96 are aligned in the X-axis direction and the Y-axis direction, and the position of the spot of the laser beam L is set on the center line of one planned dividing line 69 (that is, alignment is performed). Next, while the wafer 61 is irradiated with the laser beam L from the undersurface 61b side, the laser processing head 92 and the chuck table 96 are moved relative to each other along the processing feed direction. Then, the device region 65 is subjected to ablation processing along all of the planned dividing lines 69 parallel with one direction. Incidentally, the imaging of the trace 77b may also be performed during the cutting, and an amount of displacement of $\pm\Delta$ μm between the position of the spot of the laser beam L and the position of the center line of a planned dividing line 69 may be detected. As in the first embodiment, the detected displacement of $\pm\Delta$ μm is eliminated when the chuck table 52 is moved in the indexing feed direction.

Figure 10:
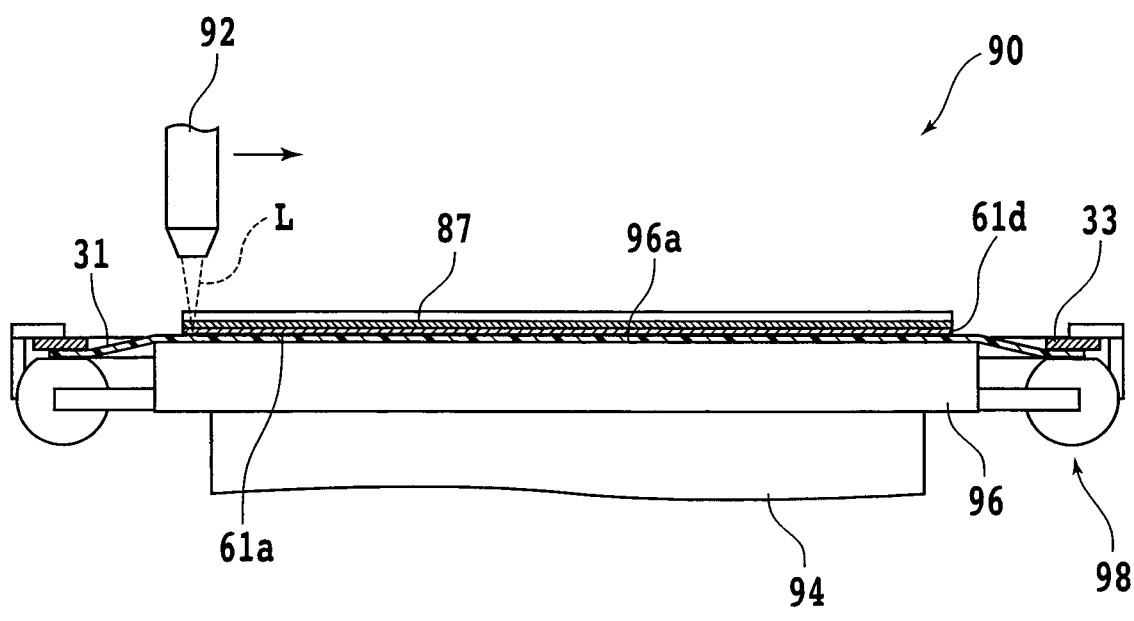
FIG. 10 is a partially sectional side view illustrating a device region processing step.
Figure 10:
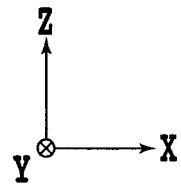

Next, the chuck table 96 is rotated by 90 degrees, and the device region 65 is subjected to ablation processing along all of the planned dividing lines 69 parallel with another direction orthogonal to the one direction. The device region 65 is thereby divided into a plurality of device chips. FIG. 10 is a partially sectional side view illustrating the device region processing step (S30). After an end of the device region processing step (S30), the frame unit 85 is moved from the laser processing apparatus 90 to an ultraviolet irradiating apparatus (not illustrated), and the resin sheet 31 is irradiated with ultraviolet rays to decrease the adhesive force of the resin sheet 31. Next, the divided plurality of device chips are extracted from the chuck table 96. In the present embodiment, the resin sheet 31 is affixed to the top surface 61a side of the wafer 61, and therefore there is no need for equipment such as a special chuck table or the like for affixing the resin sheet 31 so as to follow the recessed portion on the undersurface 61b side. In addition, the alignment at the time of the processing can be performed by using an ordinary visible light camera rather than an infrared camera that observes the top surface 61a side from the undersurface 61b side by using infrared rays passing through the wafer 61.

Incidentally, so-called stealth dicing processing may be performed in the device region processing step (S30) of the second embodiment. The stealth dicing processing is performed mainly by using the same apparatus as the laser processing apparatus 90 except for the wavelength of the laser beam and the like. Thus, the stealth dicing processing will be described by using constituent elements of the laser processing apparatus 90. In the stealth dicing processing, first, the chuck table 96 sucks and holds the top surface 61a side of the wafer 61. Next, a laser beam of a wavelength (1064 nm or 1300 nm, for example) passing through the wafer 61 is applied from the laser processing head 92 to the undersurface 61b side of the wafer 61, and the focusing point of the laser beam is positioned within the wafer 61.

Then, a modified layer is formed within the wafer 61 along the planned dividing lines 69 by moving the laser processing head 92 and the chuck table 96 relative to each other along the processing feed direction. Incidentally, in the wafer 61, a plurality of modified layers may be formed at different positions in the thickness direction of the wafer 61. Next, the wafer 61 is divided into a plurality of device chips by using a breaking apparatus (not illustrated) that applies stress to the undersurface 61b side of the wafer 61 or an expander (not illustrated) that expands the resin sheet 31 of the frame unit 85. Thereafter, the frame unit 85 is moved to the ultraviolet irradiating apparatus (not illustrated), and the adhesive force of the resin sheet 31 is decreased. Next, the divided plurality of device chips are extracted from the chuck table 96.

In addition, structures, methods, and the like according to the foregoing embodiments can be modified and carried out as appropriate without departing from the objective scope of the present invention. For example, it is not essential to affix the annular frame 33 to the resin sheet 31. A workpiece such as the resin package substrate 11, the wafer 61, or the like may be fixed on a resin sheet 31 equal to or larger than the size as viewed in plan of the workpiece, and then the workpiece may be cut. In addition, the key patterns 27 or the key patterns 77 may be used not only for cutting and laser processing but also for forming a plasma dicing mask on the workpiece. For example, the undersurface 61b side of the wafer 61 is coated with a transparent or semitransparent liquid resin serving as a mask for plasma, and thereafter the positions of the planned dividing lines 69 are identified by using the traces 77b of the key patterns 77 transferred onto the resin sheet 31. Then, a resin layer in which the liquid resin is solidified is subjected to ablation processing by a laser beam, and the resin layer is removed along the planned dividing lines 69. Thereafter, with the resin layer as a mask, the resin layer being partly removed along the planned dividing lines 69, the wafer 61 is cut by plasma along the planned dividing lines 69 (plasma dicing).

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece processing method for processing a plate-shaped workpiece from an undersurface side of the workpiece, the workpiece including a device region having a device in each region demarcated by a plurality of planned dividing lines intersecting each other, a peripheral surplus region surrounding the device region, and key patterns having a recessed portion or a projecting portion, the key patterns being arranged on a top surface side of the workpiece in the peripheral surplus region so as to correspond to the plurality of planned dividing lines, the workpiece processing method comprising:
   a resin sheet sticking step of sticking a resin sheet to the top surface side of the workpiece, and transferring the key patterns onto the resin sheet;
   a peripheral surplus region removing step of dividing the peripheral surplus region from the workpiece, and peeling off the peripheral surplus region from the resin sheet; and
   a device region processing step of identifying a position of at least one planned dividing line among the plurality of planned dividing lines by using, as marks, traces of the key patterns in the peripheral surplus region exposed in the peripheral surplus region removing step, and processing the device region along the plurality of planned dividing lines.

2. The workpiece processing method according to claim 1, wherein
   in the resin sheet sticking step, a frame unit including the workpiece, an annular frame, and the resin sheet is formed by disposing the annular frame so as to surround a periphery of the workpiece, and then sticking the resin sheet to the top surface side of the workpiece and the annular frame.

3. The workpiece processing method according to claim 1, wherein
   in the device region processing step, the workpiece is processed by cutting the workpiece with a cutting blade, or the workpiece is processed by irradiating the workpiece with a laser beam.

* * * * *